(12) United States Patent
Yang et al.

(10) Patent No.: US 9,333,682 B2
(45) Date of Patent: May 10, 2016

(54) STAMP, METHOD OF FABRICATING THE STAMP, AND IMPRINT METHOD USING THE SAME

(75) Inventors: Ki-yeon Yang, Seoul (KR); Byung-kyu Lee, Seoul (KR); Du-hyun Lee, Suwon-si (KR); Woong Ko, Hwaseong-si (KR); Jae-kwan Kim, Daejeon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 228 days.

(21) Appl. No.: 13/620,219

(22) Filed: Sep. 14, 2012

(65) Prior Publication Data

US 2013/0187309 A1 Jul. 25, 2013

(30) Foreign Application Priority Data

Jan. 20, 2012 (KR) .................. 10-2012-0006803

(51) Int. Cl.
| | |
|---|---|
| *B29C 43/02* | (2006.01) |
| *G03F 7/00* | (2006.01) |
| *B29C 43/10* | (2006.01) |
| *B82Y 10/00* | (2011.01) |
| *B82Y 40/00* | (2011.01) |
| *B29C 43/32* | (2006.01) |
| *B29C 43/36* | (2006.01) |

(52) U.S. Cl.
CPC ............... *B29C 43/021* (2013.01); *B29C 43/10* (2013.01); *B82Y 10/00* (2013.01); *B82Y 40/00* (2013.01); *G03F 7/0002* (2013.01); *B29C 2043/025* (2013.01); *B29C 2043/3233* (2013.01); *B29C 2043/3238* (2013.01); *B29C 2043/3615* (2013.01)

(58) Field of Classification Search
CPC ..................... B29C 2059/023; Y10S 977/887; Y10S 977/889; G03F 7/0002
See application file for complete search history.

(56) References Cited

U.S. PATENT DOCUMENTS

| | | | |
|---|---|---|---|
| 7,803,308 B2 * | 9/2010 | GanapathiSubramanian et al. | 264/334 |
| 2001/0048900 A1 * | 12/2001 | Bardell et al. | 422/100 |
| 2004/0009673 A1 * | 1/2004 | Sreenivasan et al. | 438/694 |
| 2010/0072652 A1 | 3/2010 | GanapathiSubramanian et al. | |
| 2010/0244326 A1 * | 9/2010 | Tokue et al. | 264/409 |

FOREIGN PATENT DOCUMENTS

| | | |
|---|---|---|
| KR | 100887381 B1 | 2/2009 |
| KR | 1020090017469 | 2/2009 |
| KR | 20100107390 A | 10/2010 |
| WO | WO-2009099630 A1 | 8/2009 |

OTHER PUBLICATIONS

Qin, S.-J., and W.J. Li, Micromachining of complex channel systems in 3D quartz substrates using Q-switched Nd:YAG laser, Applied Physics A, vol. 74, issue 6 (Jun. 2002), pp. 773-777.*

* cited by examiner

*Primary Examiner* — Matthew Daniels
(74) *Attorney, Agent, or Firm* — Harness, Dickey & Pierce, P.L.C.

(57) ABSTRACT

A stamp includes a transparent body having an inner chamber containing an inlet/outlet tube configured to have a fluid injected and removed therefrom.

20 Claims, 7 Drawing Sheets

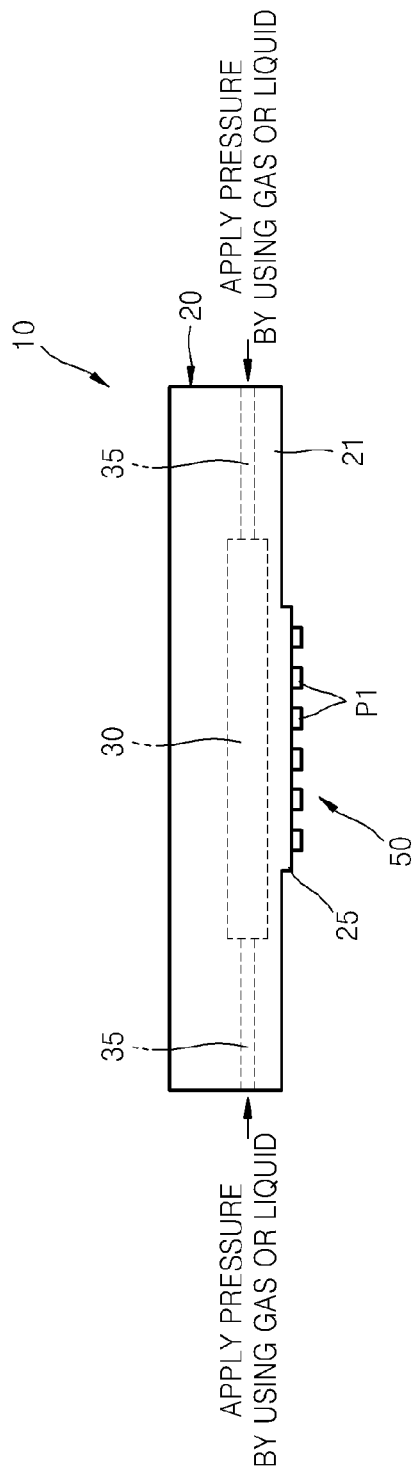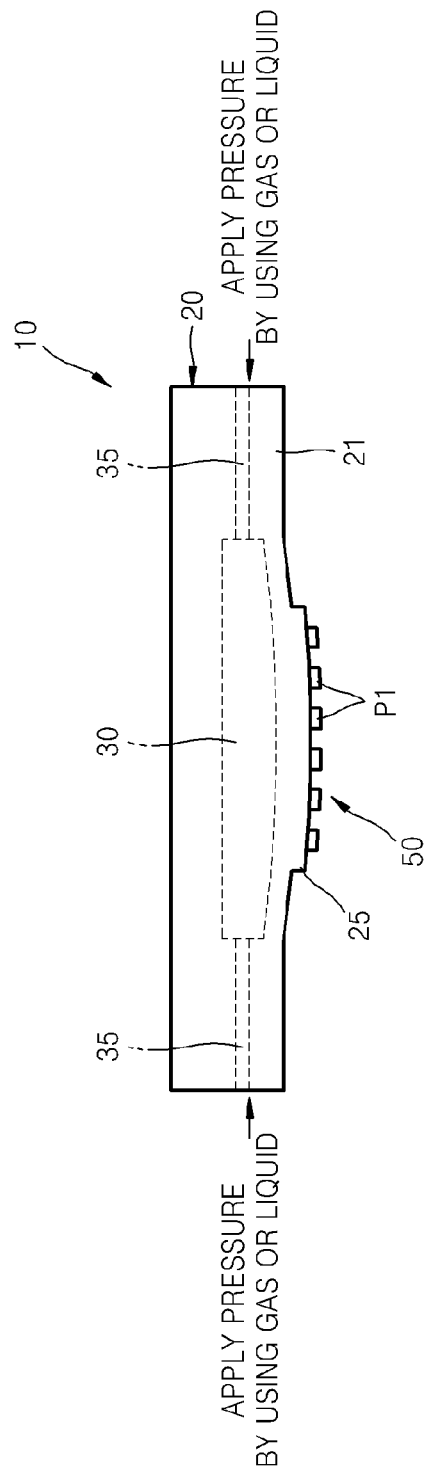

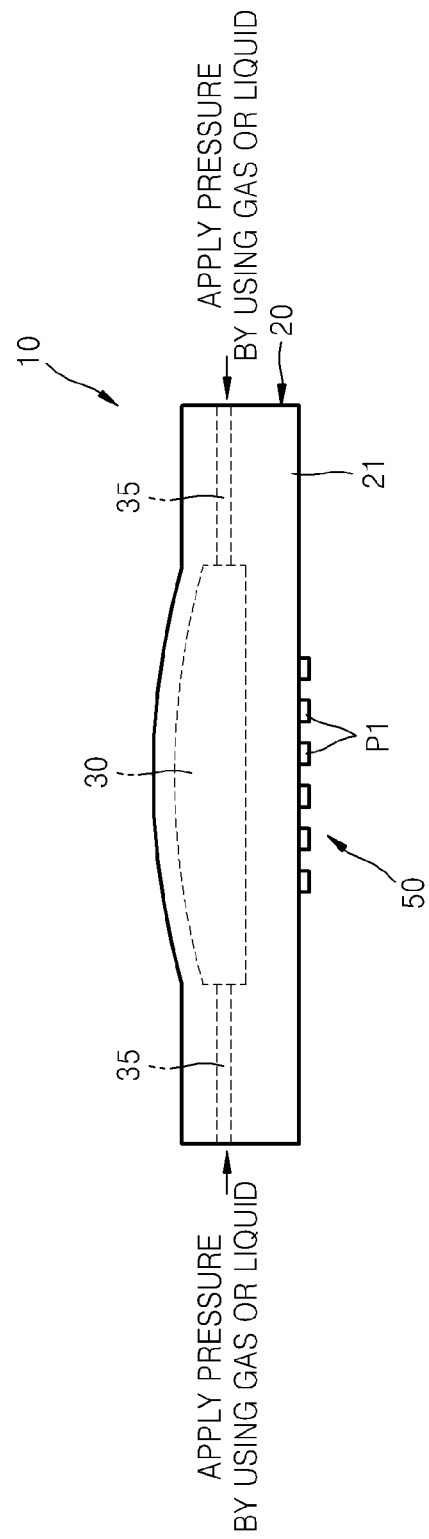

STAMP, METHOD OF FABRICATING THE STAMP, AND IMPRINT METHOD USING THE SAME

CROSS-REFERENCE TO RELATED APPLICATIONS

This application claims the benefit of Korean Patent Application No. 10-2012-0006803, filed on Jan. 20, 2012, in the Korean Intellectual Property Office, the disclosure of which is incorporated herein in its entirety by reference.

BACKGROUND

1. Field

The present disclosure relates to stamps, methods of fabricating the stamps, and imprint methods using the same.

2. Description of the Related Art

Nanoimprint lithography (NIL) is a technology of pressing a stamp onto an imprint resist layer of a substrate to transfer a nano-pattern formed on a surface of the stamp to the imprint resist layer. In NIL, the nano-pattern is formed due to a direct contact between the stamp and the imprint resist layer. NIL is divided into thermal NIL and ultraviolet (UV)-curable NIL according to external energy used to form a pattern. A representative example of UV-curable NIL is step and flash imprint lithography (S-FIL). S-FIL is a technology of coating a UV-curable liquid imprint resin on a substrate, pressing a transparent stamp onto the imprint resin, and curing the imprint resin by using UV rays, thereby performing an imprint process.

Productivity, uniformity, and accuracy of S-FIL depends on various factors. For instance, how well a resin is coated, spread into a pattern, cured, aligned, uniformly pressed, etc. To improve these various factors, development of a resin and components of an NIL system is required.

SUMMARY

Provided is a stamp, methods of fabricating the stamp, and imprint methods using the same.

Additional aspects will be set forth in part in the description which follows and, in part, will be apparent from the description, or may be learned by practice of the presented embodiments.

According to an example embodiment, a stamp includes a transparent body having an inner chamber containing an inlet/outlet tube configured to have a fluid injected and removed therefrom.

The transparent body may be formed of a material capable of being internally processed by using a laser to form the inner chamber and the inlet/outlet tube on the inside of the transparent body.

The transparent body may be formed of quartz.

The inner chamber may have a shape in which at least a portion of a surface of the inner chamber is one of flat, convex, and concave, if the fluid is not injected.

The inner chamber may have a circular or polygonal shape.

The stamp may be configured for use in a nanoimprint process.

According to another example embodiment, a method of fabricating a stamp includes internally processing a transparent body by using a laser to form an inner chamber in the transparent body; and forming in the transparent body an inlet/outlet tube configured to have a fluid injected and removed therefrom.

The internal processing may be performed by using a femtosecond laser.

According to another example embodiment, an imprint method includes injecting the fluid into the inner chamber of the stamp to increase an internal pressure of the inner chamber and thus to inflate the transparent body of the stamp; coating a resin on a substrate; and contacting the stamp, in which the transparent body is inflated, with the substrate coated with the resin.

The imprint method may further include reducing the pressure of the inner chamber of the transparent body after the stamp contacts the substrate coated with the resin.

BRIEF DESCRIPTION OF THE DRAWINGS

These and/or other aspects will become apparent and more readily appreciated from the following description of the embodiments, taken in conjunction with the accompanying drawings of which:

FIGS. 6A through 6E are cross-sectional views for describing an imprint process using the stamp according to an example embodiment;

FIG. 8 is a cross-sectional view showing an example in which the stamp illustrated in FIG. 7 is inflated.

DETAILED DESCRIPTION

Figure 1:
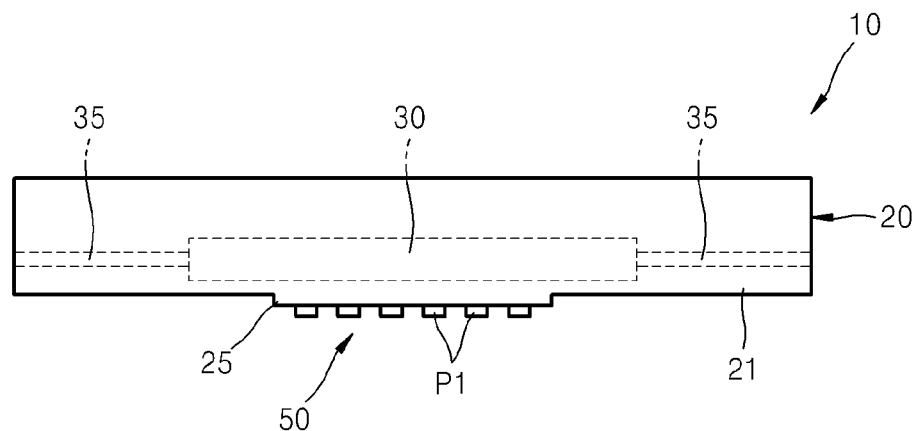
FIG. 1 is a cross-sectional view of a stamp according to an example embodiment.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

Figure 2:
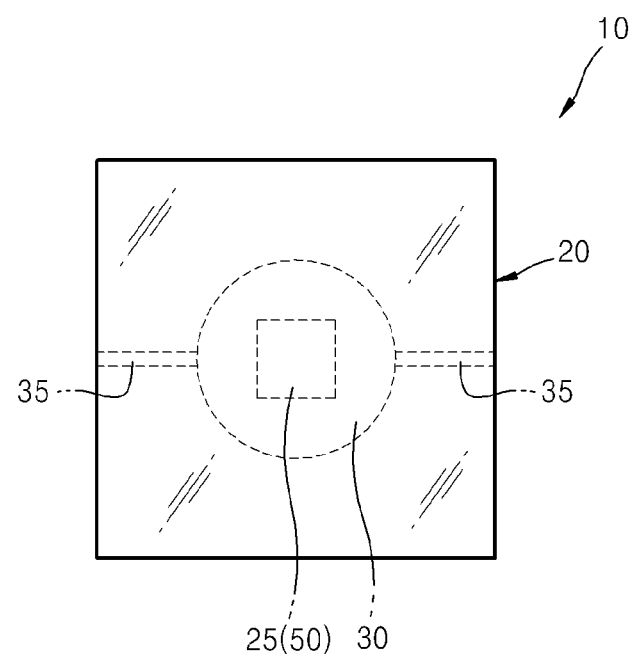
FIG. 2 is a plan view of the stamp illustrated in FIG. 1.

FIG. 1 is a cross-sectional view of a stamp 10 according to an example embodiment. FIG. 2 is a plan view of the stamp 10 illustrated in FIG. 1.

Referring to FIGS. 1 and 2, the stamp 10 includes an inner chamber 30 and a transparent body 20 having an inlet/outlet tube 35 through which a fluid flows into or out of the inner chamber 30. An uneven part 50 may be formed on a lower surface 21 of the transparent body 20.

The transparent body 20 may have a seamless single body structure. The transparent body 20 may be formed of a material capable of being internally processed by using a laser to form the inner chamber 30 and the inlet/outlet tube 35. For example, the transparent body 20 may be formed of quartz.

The stamp 10 may have an inner pressing system and is formed by internally processing a transparent blank, e.g., a quartz blank, by using a laser, e.g., a femtosecond laser, so as to form the inner chamber 30 and the inlet/outlet tube 35 through which a fluid flows into or out of the inner chamber 30. By forming the stamp 10 in this manner, the transparent body 20 has a seamless single body structure and the inner chamber 30 and the inlet/outlet tube 35 may be obtained such that when the fluid is injected into the inner chamber 30 an internal pressure of the inner chamber 30 may be rapidly adjusted resulting in conformal contact characteristics with a substrate may be improved.

When a femtosecond laser is used, since an inner part of a transparent blank may be easily processed to a level of about 1 μm, the inner chamber 30 may be formed relatively closely to the lower surface 21 of the stamp 10 (where the uneven part 50 is formed). Also, due to the laser processing, the inner chamber 30 may have a small size. Further, due to the laser processing, the inner chamber 30 may be formed to have various shapes, e.g., a three-dimensional (3D) shape.

When the internal pressure of the inner chamber 30 is increased, a thin portion of the transparent body 20 under the inner chamber 30 may be easily inflated and thus conformal contact characteristics with a substrate may be improved.

Since the inner chamber 30 is formed in the transparent body 20 and thus the stamp 10 may have flat outer surfaces except for the lower surface 21 where the uneven part 50 is formed, the stamp 10 may be easily handled by using a typical handling device and may have a simple structure merely required to externally connect a passage for flowing a fluid such as a gas or a liquid. Also, since the transparent body 20 is formed as a seamless single body, a complicated gas leakage prevention device may not be required.

Figure 3:
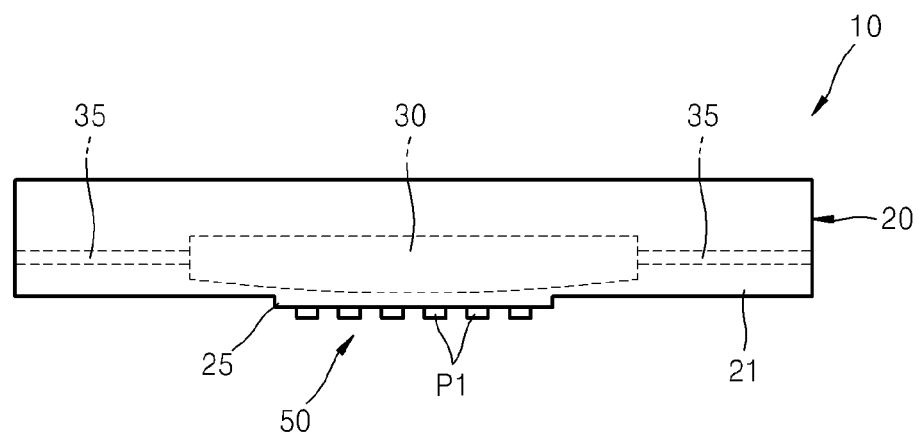
FIGS. 3 and 4 are cross-sectional views of stamps according to other example embodiments.
Figure 4:
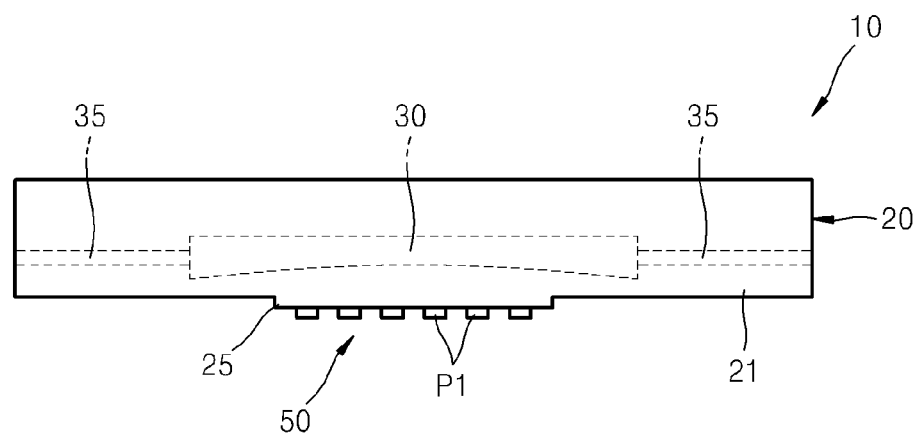

The inner chamber 30 may have various shapes. The inner chamber 30 may have a shape in which at least a portion of a surface of the inner chamber 30 relatively close to the uneven part 50, i.e., a bottom surface of the inner chamber 30, is flat, convex, or concave as illustrated in FIG. 1, 3, or 4, when a fluid is not injected. FIG. 1 shows an example in which the surface of the inner chamber 30 relatively close to the uneven part 50, i.e., the bottom surface of the inner chamber 30, is flat. FIGS. 3 and 4 respectively show examples in which the surface of the inner chamber 30 relatively close to the uneven part 50, i.e., the bottom surface of the inner chamber 30, is respectively convex and concave.

Figure 5:
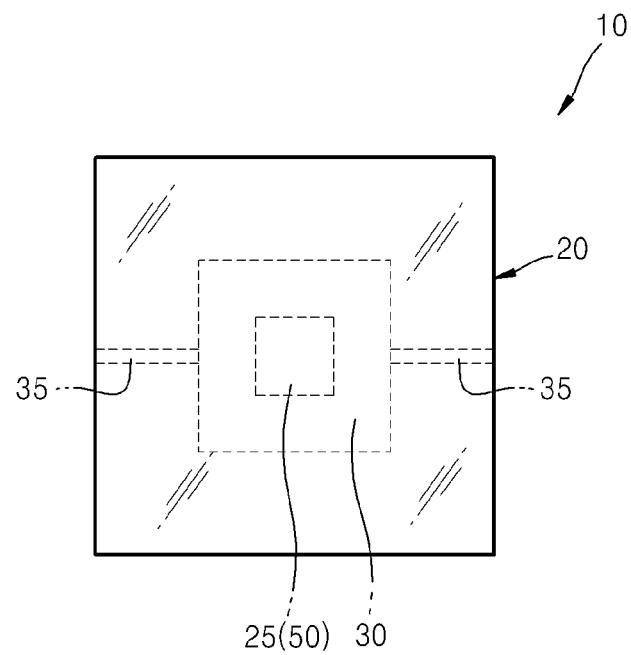
FIG. 5 is a plan view of a stamp according to another example embodiment.

Also, the inner chamber 30 may have overly a circular shape as illustrated in FIG. 2. Alternatively, the inner chamber 30 may have overly a rectangular shape as illustrated in FIG. 5 or may have various polygonal shapes.

The uneven part 50 may be formed on the lower surface 21 of the transparent body 20. For example, a pedestal 25 may protrude on the lower surface 21 of the transparent body 20 and the uneven part 50 may be formed on the pedestal 25. The pedestal 25 may be single body with the transparent body 20. That is, when the transparent blank is formed, the transparent blank may be processed to have the pedestal 25. Alternatively, the pedestal 25 may be additionally formed as a transparent layer on the transparent blank before the laser processing is performed, or on the transparent body 20 including the inner chamber 30 and the inlet/outlet tube 35 after the laser processing is performed. In this case, the pedestal 25 may be formed of a transparent material the same as or different from the material of the transparent body 20.

The uneven part 50 may be formed of a material the same as or different from the material of the transparent body 20. The uneven part 50 may include one or more protrusions P1. A plurality of protrusions P1 may be spaced apart from each other. An empty space between two neighboring protrusions P1 forms a "recess". The uneven part 50 may have a structure in which the protrusions P1 and the recesses are alternately disposed. The protrusions P1 may have a nano-size width. That is, the width of the protrusions P1 may be about several to several hundred nm, e.g., about several to several ten nm. The distance between the protrusions P1 may also be about several to several hundred nm, e.g., about several to several ten nm.

When the uneven part 50 has an uneven pattern including protrusions P1 that are spaced apart from one another by a nanoscale distance then the stamp 10 may be used in a nanoimprint process. That is, when the stamp 10 in which an uneven pattern having the nanoscale protrusions P1 is formed on the uneven part 50 is used, a nanoimprint pattern may be formed.

The above-described stamp 10 may be obtained by laser processing a seamless transparent blank to form the inner chamber 30 and the inlet/outlet tube 35 through which a fluid flows into or out of the inner chamber 30, and forming the uneven part 50 on the lower surface 21 of the transparent body 20.

According to the above-described stamp 10, in a step and flash imprint lithography (S-FIL) process, when the fluid such as a gas or a liquid is injected into the inner chamber 30 to increase the internal pressure of the inner chamber 30 and thus to inflate a thin portion of the transparent body 20 under the inner chamber 30, conformal contact characteristics with a substrate may be improved such that a resin may be rapidly coated.

According to the above-described stamp 10, the internal pressure of the inner chamber 30 may be rapidly adjusted because the inner chamber 30 has a relatively small size and the stamp 10 may be easily handled by using a typical blank handling device because a central portion of the stamp 10 is not recessed. Also, since a femtosecond laser allows processing to a level of about 1 μm, the inner chamber 30 may be formed relatively closely to the lower surface 21 of the stamp 10, that is, where an imprint pattern is formed, and may be formed to have a 3D shape.

FIGS. 6A through 6E are cross-sectional views for describing an imprint process using the stamp 10, according to an example embodiment. When the uneven part 50 of the stamp 10 has a nanoscale uneven pattern, a nanoimprint pattern may be formed.

Figure 6A:
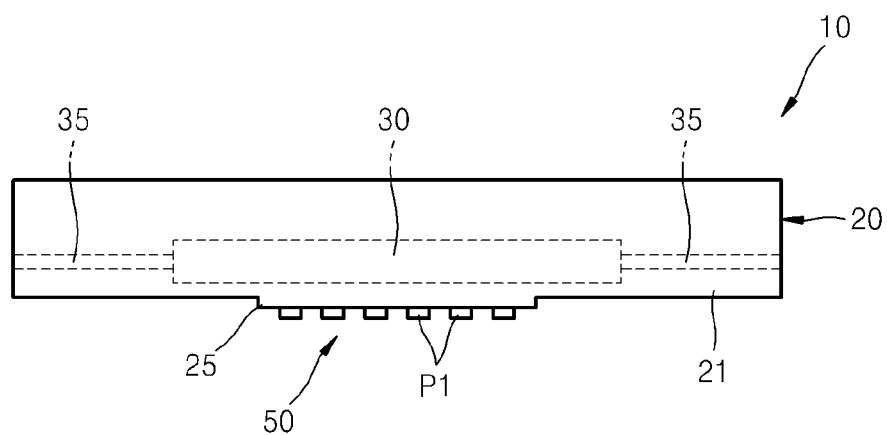

Initially, as illustrated in FIG. 6A, the stamp 10 is prepared.

Then, when a fluid such as a gas or a liquid is injected into the inner chamber 30 of the stamp 10 through the inlet/outlet tube 35, as illustrated in FIG. 6B, the internal pressure of the inner chamber 30 is increased and a thin portion of the transparent body 20 relatively close to where the uneven part 50 is formed is inflated, as illustrated in FIG. 6C.

Figure 6D:
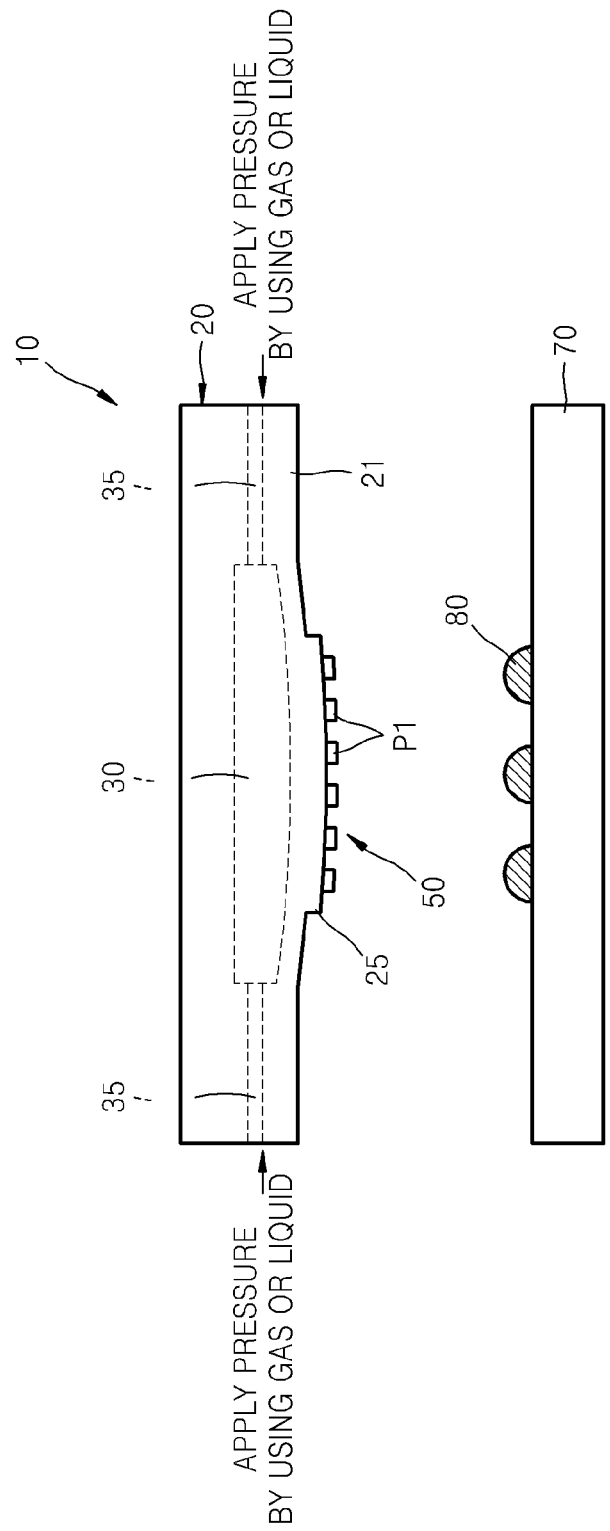
Figure 6E:
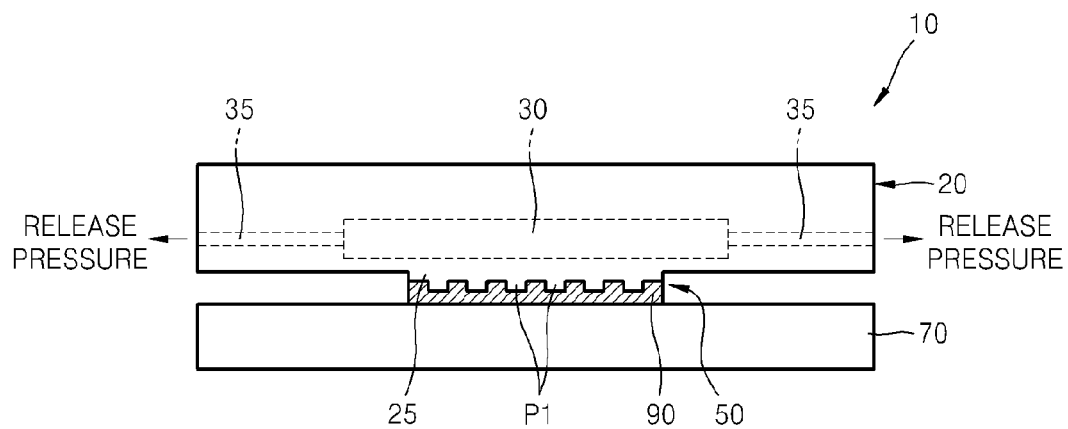

When a resin 80 is coated on a substrate 70, as illustrated in FIG. 6D, and when the stamp 10 in which the portion of the transparent body 20 relatively close to where the uneven part 50 is formed is inflated contacts the substrate 70 coated with the resin 80, so as to form a resin layer 90, as illustrated in FIG. 6e, the pattern of the uneven part 50 of the stamp 10 may be transferred to the resin layer 90. In this case, the pressure of the inner chamber 30 may be reduced while the stamp 10 contacts the substrate 70 coated with the resin layer 90. In this case, conformal contact may be achieved and the resin 80 may be coated more rapidly. The resin 80 may be an ultraviolet (UV)-curable liquid imprint resin. Here, the resin layer 90 may refer to a layer of the resin 80 that is pressed and spread by the stamp 10.

When the stamp 10 is separated form the resin layer 90 after the resin layer 90 is pressed by the stamp 10, an inverse imprint pattern of the pattern of the uneven part 50 of the stamp 10 may be formed. Before the stamp 10 is separated, a desired (or, alternatively predetermined) curing process may be performed on the resin layer 90. That is, the stamp 10 may be separated after the resin layer 90 is cured. In this case, since the stamp 10 is overall transparent, the resin layer 90 may be cured, for example, by irradiating UV rays.

When the nanoscale protrusions P1 are formed on the uneven part 50, the imprint process may be a nanoimprint process and thus a nanoimprint pattern may be formed.

As described above, an imprint pattern, e.g., a nanoimprint pattern, may be formed by coating the resin 80 on the substrate 70, pressing the transparent stamp 10 onto the resin 80, and then curing the resin 80. Here, the stamp 10 may also be used in, for example, a thermal imprint method using heat to cure the resin layer 90. In this case, the stamp 10 may not be limited to a transparent material.

According to the above-described imprint method using the stamp 10, conformal contact between the substrate 70 and the stamp 10 may be achieved, a time taken to coat the resin 80 may be reduced, and thus productivity of an S-FIL process may be improved when compared to imprint methods using a conventional stamp.

Also, since the inner chamber 30 is formed in the stamp 10, the stamp 10 may be easily handled by using an existing transparent blank handling device.

Furthermore, since a femtosecond laser allows processing of quartz to a level of about 1 μm, the inner chamber 30 may be formed relatively closely to the uneven part 50 and may have a relatively small size, and thus a portion of the transparent body 20 under the inner chamber 30 may be easily deformed, and thus an internal pressure of the inner chamber 30 may be rapidly adjusted.

Although the inner chamber 30 is formed relatively closely to the lower surface 21 of the stamp 10 in the above descriptions, the inner chamber 30 of the stamp 10 may be formed in an upper portion of the stamp 10 or may be formed in a vertical direction.

Figure 7:
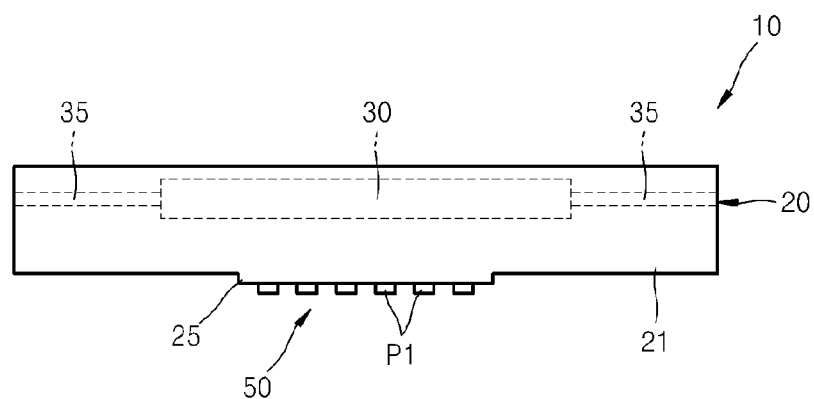
FIG. 7 is a cross-sectional view of a stamp according to another example embodiment.

For example, as illustrated in FIG. 7, the inner chamber 30 may be formed in an upper portion of the stamp 10. In this case, when a fluid such as a gas or a liquid is injected into the inner chamber 30 of the stamp 10 through the inlet/outlet tube 35, as illustrated in FIG. 8, the internal pressure of the inner chamber 30 is increased and a thin upper portion of the transparent body 20 relatively far from where the uneven part 50 is formed is inflated. In this case, when the stamp 10 is pressed from an upper part, the upward inflated portion uniformly disperses a force of pressing the stamp 10. Accordingly, when the inner chamber 30 is formed in the upper portion of the stamp 10, it is possible to press further uniformly.

Here, even when the inner chamber 30 is formed in the upper portion of the stamp 10, as illustrated in FIGS. 7 and 8, the inner chamber 30 may have various shapes as described above with reference to FIGS. 3 and 4.

As described above, according to one or more of the above example embodiments, when an inner chamber is formed in a lower portion of a stamp, in an S-FIL process, since a fluid such as a gas or a liquid is injected into the inner chamber of the stamp to increase an internal pressure of the inner chamber and thus to inflate a thin portion of a transparent body under the inner chamber, conformal contact characteristics with a substrate may be improved such that a resin may be rapidly coated. Also, when the inner chamber is formed in an upper portion of the stamp, it is possible to press further uniformly. Furthermore, when the inner chamber is formed in a vertical direction, accurate alignment may be achieved.

It should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. A stamp comprising:
a transparent body having an inner chamber and an uneven part formed on one surface of the transparent body, the inner chamber containing an inlet/outlet tube, the inner chamber being formed closer to an opposite surface of the transparent body than the uneven part such that a thin portion of the transparent body is far from the uneven part and close to the opposite surface of the transparent body, the inlet/outlet tube configured to have a fluid injected and removed therefrom,
wherein the transparent body is formed as a seamless single body and the thin portion of the transparent body is configured to inflate by increasing an internal pressure of the inner chamber.

2. The stamp of claim 1, wherein the transparent body is formed of a material capable of being internally processed by using a laser to form the inner chamber and the inlet/outlet tube on the inside of the transparent body.

3. The stamp of claim 1, wherein the transparent body is formed of quartz.

4. The stamp of claim 1, wherein the inner chamber has a shape in which at least a portion of a surface of the inner chamber is one of flat, convex, and concave, if the fluid is not injected.

5. The stamp of claim 1, wherein the inner chamber has a circular or polygonal shape.

6. The stamp of claim 1, wherein the stamp is configured for use in a nanoimprint process.

7. A method of fabricating a stamp, the method comprising:
internally processing a transparent body by using a laser to form an inner chamber in the transparent body and an uneven part on one surface of the transparent body, the inner chamber being formed closer to an opposite surface of the transparent body than the uneven part such that a thin portion of the transparent body is far from the uneven part and close to the opposite surface of the transparent body; and
forming in the transparent body an inlet/outlet tube, the inlet/outlet tube configured to have a fluid injected and removed therefrom such that the transparent body is formed as a seamless single body and the thin portion of the transparent body is configured to inflate by increasing an internal pressure of the inner chamber.

8. The method of claim 7, wherein the internal processing is performed by using a femtosecond laser.

9. The method of claim 7, wherein the transparent body is formed of a material capable of being internally processed by using a laser to form the inner chamber and the inlet/outlet tube on the inside of the transparent body.

10. The method of claim 7, wherein the transparent body is formed of quartz.

11. The method of claim 7, wherein the inner chamber has a shape in which at least a portion of a surface of the inner chamber is one of flat, convex, and concave, if the fluid is not injected.

12. The method of claim 7, wherein the inner chamber has a circular or polygonal shape.

13. The method of claim 7, wherein the stamp is configured for use in a nanoimprint process.

14. An imprint method comprising:
providing a stamp including a transparent body having an inner chamber and an uneven part formed on one surface of the transparent body, the inner chamber containing an inlet/outlet tube, the inner chamber being formed closer to an opposite surface of the transparent body than the uneven part such that a thin portion of the transparent body is far from the uneven part and close to the opposite surface of the transparent body, the inlet/outlet tube configured to have a fluid injected and removed therefrom, the transparent body being formed as a seamless single body and the thin portion of the transparent body being configured to inflate by increasing an internal pressure;

injecting a fluid into the inner chamber of the stamp to increase the internal pressure of the inner chamber and thus to inflate the transparent body of the stamp;

coating a resin on a substrate; and contacting the stamp, in which the transparent body is inflated, with the substrate coated with the resin.

15. The imprint method of claim 14, wherein the transparent body is formed of a material capable of being internally processed by using a laser to form the inner chamber and the inlet/outlet tube on the inside of the transparent body.

16. The imprint method of claim 14, wherein the transparent body is formed of quartz.

17. The imprint method of claim 14, wherein the inner chamber has a shape in which at least a portion of a surface of the inner chamber is one of flat, convex, and concave, if the fluid is not injected.

18. The imprint method of claim 14, wherein the inner chamber has a circular or polygonal shape.

19. The imprint method of claim 14, further comprising:
reducing the internal pressure of the inner chamber of the transparent body after the stamp contacts the substrate coated with the resin.

20. The imprint method of claim 14, wherein the stamp is for a nanoimprint process.

* * * * *